United States Patent [19]
Suzuki et al.

[11] Patent Number: 5,785,786
[45] Date of Patent: Jul. 28, 1998

[54] ULTRASONIC WELDING METHOD

[75] Inventors: Masataka Suzuki; Hiroyuki Ashiya; Atsushi Masuda, all of Shizuoka, Japan

[73] Assignee: Yazaki Corporation, Tokyo, Japan

[21] Appl. No.: 791,055

[22] Filed: Jan. 28, 1997

[30] Foreign Application Priority Data

Jan. 29, 1996 [JP] Japan ................................. 8-012776

[51] Int. Cl.$^6$ ................................................. B32B 31/16
[52] U.S. Cl. ................... 156/73.1; 156/204; 228/110.1; 264/445
[58] Field of Search ..................... 156/47, 55, 73.1, 156/196, 199, 204, 580.1; 228/1.1, 110.1; 264/442, 443, 445; 425/174.2

[56] References Cited

U.S. PATENT DOCUMENTS

| | | | |
|---|---|---|---|
| 4,310,365 | 1/1982 | Elliott et al. | 156/55 |
| 4,391,038 | 7/1983 | Greene et al. | 156/204 X |
| 4,589,584 | 5/1986 | Christiansen et al. | 228/110.1 |
| 4,605,578 | 8/1986 | Emrich et al. | 428/57 |

FOREIGN PATENT DOCUMENTS

| | | |
|---|---|---|
| 1-139986 | 9/1989 | Japan . |
| 6-155051 | 6/1994 | Japan . |

*Primary Examiner*—James Sells
*Attorney, Agent, or Firm*—Armstrong, Westerman, Hattori, McLeland and Naughton

[57] ABSTRACT

An ultrasonic welding method for welding a first metal sheet to a second metal sheet by using an anvil and a horn includes the following steps. The first metal sheet includes a protective portion, a protected portion and a middle portion therebetween. The protective portion is folded back over the protected portion along a return line on the middle portion. The first metal sheet is mounted on the second sheet in such a way that the protected portion lays between the protective portion and the second metal sheet. The first metal sheet may be a stripped conductive flat cable; the second metal sheet may be a copper sheet; and the middle portion of the first metal sheet may remain covered by its covering material.

6 Claims, 4 Drawing Sheets

5,785,786

ULTRASONIC WELDING METHOD

FIELD OF THE INVENTION

This invention relates to an ultrasonic welding method for jointing a couple of metal sheets by utilizing ultrasonic wave.

BACKGROUND OF THE INVENTION

In a general ultrasonic welding method, a first metal sheet is laid over a second metal sheet that is mounted on an anvil. Then, a vibration applying horn abutting against the first metal sheet accomplishes the welding joint between the couple of metal sheets.

However, in this method, there has been a drawback that the direct abutment of the horn causes welding trace marks on the first metal sheet, which results in reduction in the welding strength, particularly in a remarkable reduction in the case of the first metal sheet itself having a smaller mechanical strength.

Accordingly, for example, such an ultrasonic welding method as shown in FIG. 8 has been proposed This ultrasonic welding method is used for jointing a first metal sheet a having a smaller mechanical strength, namely due to an extremely small thickness (such as a conductive flat cable or a metal foil) to a second metal sheet b (such as a copper sheet). On the metal sheet b there is laid the extremely small thickness metal sheet a. Further, to protect the extremely small thickness metal sheet a, an overlaying protective member c (for example, composed of a stripped electric cable or a copper sheet) lays over the metal sheet a. This constitutes a three layer structure consisting of the metal sheet b, the protecting member c, and the sandwiched metal sheet a. Then, the metal sheet b is mounted on an anvil d; a horn e abutted against the protective member c joints the metal sheet a to the metal sheet b by ultrasonic welding.

Thus, the protective member c prevents the extremely small thickness metal sheet a from direct abutting against the horn e. This eliminates welding trace marks caused by the welding on the extremely small thickness metal sheet a, resulting in no strength reduction in the metal sheet a after the welding.

The metal sheet a, the metal sheet b, and the protective member c constitute a separately formed three layer structure. This causes an unstable overlaying or positioning of the protective member c on the metal sheet a so that, during the ultrasonic welding, an undesirable shift c' toward one side or the opposite side tends to occur between the metal sheet a and the protective member c. Accordingly, in this method, there has still been another drawback of an unstable ultrasonic welding.

SUMMARY OF THE INVENTION

In view of the above-described drawback, an object of the present invention is to provide an improved ultrasonic welding method enabling a stable weld jointing. In the method, during the ultrasonic welding of an extremely small thickness metal sheet to another metal sheet, a protective member is stably aligning with the extremely small thickness metal sheet. That is, the method eliminates an undesirable shift between the extremely small thickness metal sheet and the protective member.

For achieving the object, according to the invention, an ultrasonic welding method for welding a first metal sheet to a second metal sheet by using an anvil and a horn includes the steps of:

defining a protective portion, a protected portion and a middle portion therebetween in the first metal sheet, each of the protective portion and the protected portion having a length corresponding to a desired weld jointing length; folding back the protective portion over the protected portion along a return line on the middle portion; and mounting the first metal sheet on the second metal sheet in such a way that the protected portion lays between the protective portion and the second metal sheet.

The first metal sheet may have a smaller mechanical strength than the second metal sheet. The first sheet may have an extremely small thickness.

Optionally, the first metal sheet is a stripped conductive flat cable. Further, the second metal sheet is a copper sheet and the middle portion of the first metal sheet remains covered by its covering material. Moreover, the flat cable remains covered by its covering material both in the middle portion and at a fore end portion of the flat cable. The flat cable includes a plurality of conductors.

Next, operational effects of the invention will be discussed in the following.

According to the basic aspect of the invention, the first metal sheet has both the protective portion and the protected portion that is folded back to lay over and to stably align with the protected portion, the protected portion including a welded zone. Thereby, the protective portion overlays completely the protected portion, which prevents undesirable shifts between the protective portion and the protected portion during the ultrasonic welding. This enables a stable ultrasonic welding and increases reliability in the welding work process. Further, the use of the first metal sheet as the protective portion eliminates the provision of another cover sheet unlike the prior art.

In addition, according to the optional aspect of the invention, the middle cover-compensated portion of the flat cable provided between the protective portion and the protected portion prevents more effectively undesirable shifts of the protective portion, when folded back along the return line on the covered portion.

DETAILED DESCRIPTION OF THE PREFERRED EMBODIMENTS

Referring to the accompanying drawings, embodiments of the invention will be discussed in the following.

Figure 1:
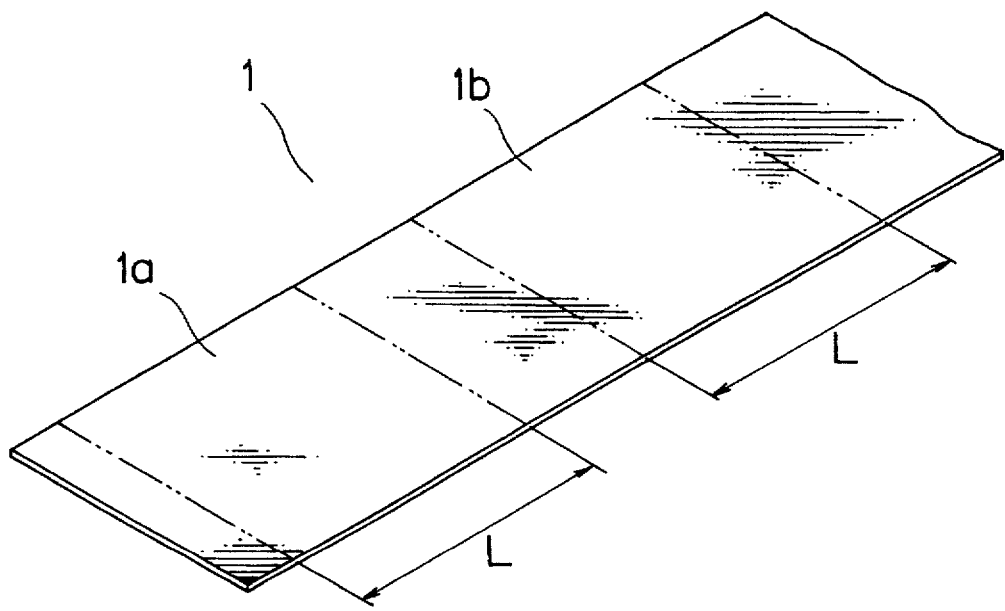
FIG. 1 is a perspective view showing an extremely small thickness metal sheet in a first embodiment of an ultrasonic welding method according to the invention.
Figure 2:
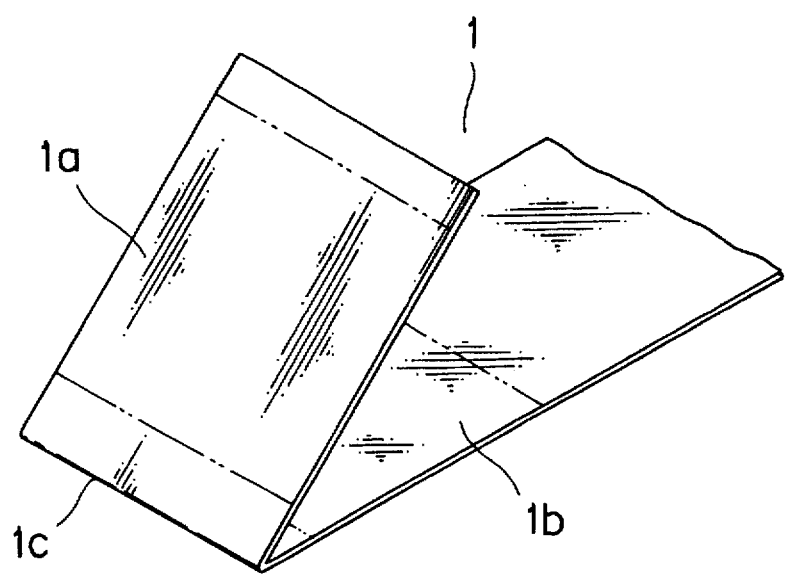
FIG. 2 is a perspective view showing a half-folded-back state of the extremely small thickness metal sheet.
Figure 3:
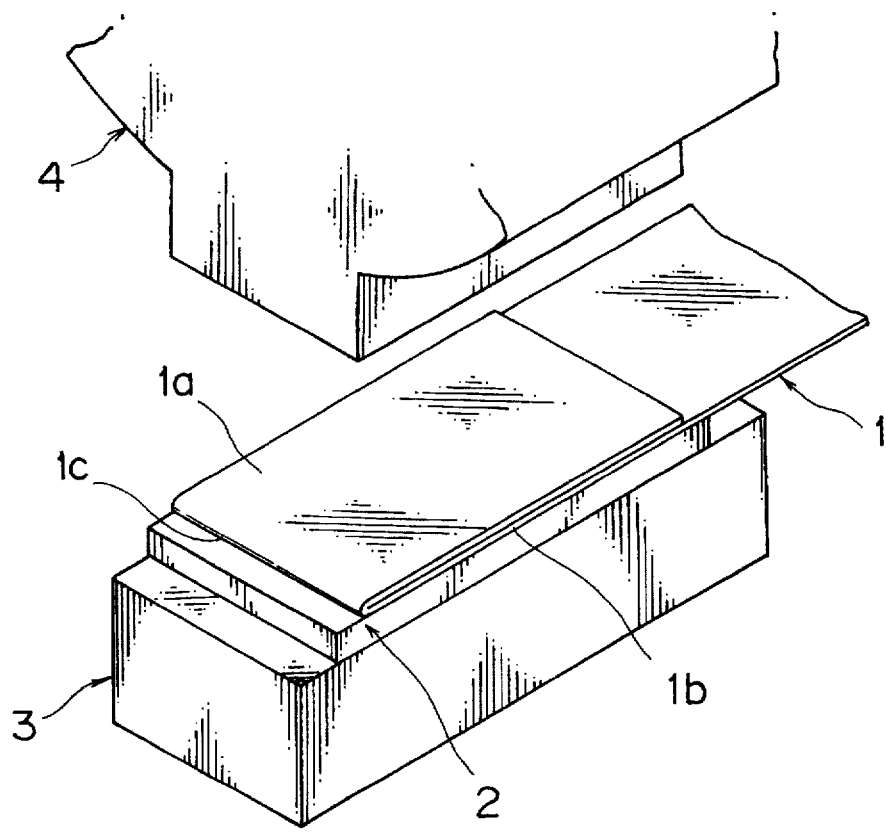
FIG. 3 is a perspective view showing a state before ultrasonic welding of the extremely small thickness metal sheet and another metal sheet.

FIGS. 1 to 3 show a first embodiment of an ultrasonic welding method according to the invention. In this ultrasonic welding method, as shown in FIG. 1, a first extremely small thickness metal sheet 1 having a smaller mechanical strength includes a protective portion 1a and a protected portion 1b. Both the protective portion 1a and the protected portion 1b have a length sufficient for the welding length L. As shown in FIG. 2, the protective portion 1a is folded back along a return line 1c perpendicular to the longitudinal direction of the sheet 1 and positioned between the protective portion 1a and the protected portion 1b. Thus, the protective portion 1a lays over the protected portion 1b.

Then, as shown in FIG. 3, the metal sheet 1 is mounted on a second metal sheet 2 that will be jointed by the welding to the protected portion 1b of the metal sheet 1; the metal sheet 2 is set on an anvil 3; and a horn 4 is abutted against the protective portion 1a from above to joint the extremely small thickness metal sheet 1 and the metal sheet 2 by the ultrasonic welding.

This process enables the correct, stable arrangement of the folded protective portion 1a on the protected portion 1b. Thus improved positioning or arrangement of the folded protective portion 1a and the protected portion 1b causes no undesirable shifts between the protective portion 1a and the protected portion 1b during the ultrasonic welding. This accomplishes a stable ultrasonic welding and a more reliable welding work process.

Figure 4:
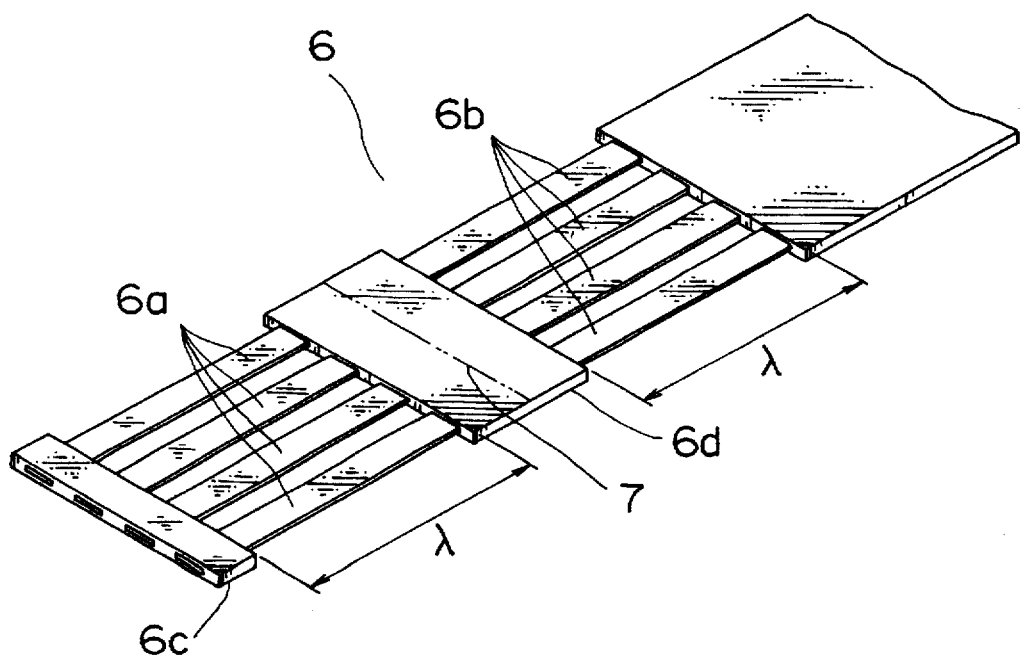
FIG. 4 is a perspective view showing a flat cable and its conductors in a second embodiment of an ultrasonic welding method according to the invention.

FIGS. 4 to 7 show a second embodiment of an ultrasonic welding method according to the invention. In this welding method, as shown in FIG. 4, the extremely small thickness metal sheet 1a (FIG. 1) is replaced by a flat cable 6 including stripped conductor portions 6a and 6b of a 30 μm thickness and the metal sheet 2 (FIG. 3) is defined as a 0.4 mm thickness copper sheet 8 that will be jointed to the conductors 6b by the welding.

First, the flat cable 6 has a fore end covered portion 6c of a desired length, the stripped protective conductive sheet 6a having a welding length λ backwardly adjacent to the fore portion 6c, a middle covered portion 6d of a desired length backwardly adjacent to the sheet 6a, and a protected stripped conductive sheet 6b having the welding length λ backwardly adjacent to the middle portion 6d. The second embodiment includes the plurality of protecting sheets 6a and the plurality of associated protected sheets 6b.

Figure 5:
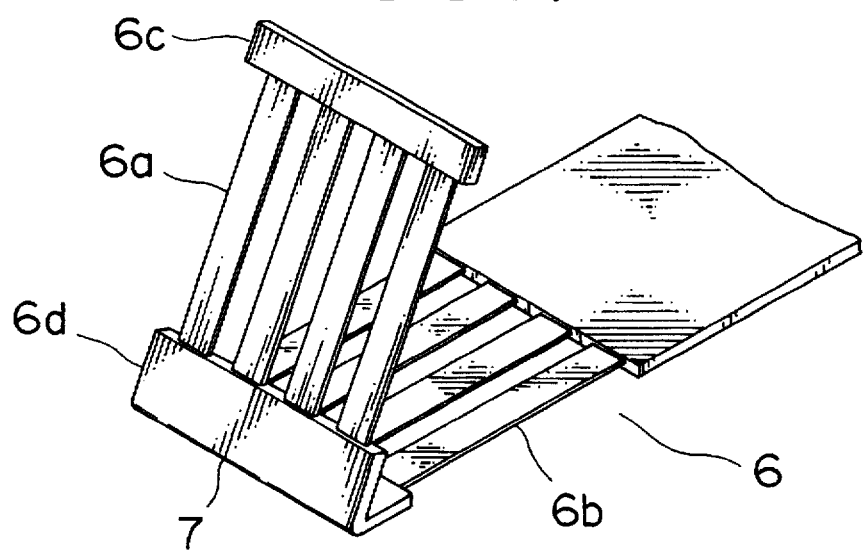
FIG. 5 is a perspective view showing a half-folded-back state of the flat cable including the conductors.

Next, as shown in FIG. 5, along a central return line 7 on the middle covered portion 6d and perpendicular to the longitudinal direction of the flat cable 6, the protecting conductive sheet 6a is folded back to lay over the protected conductive sheet 6b.

Figure 6:
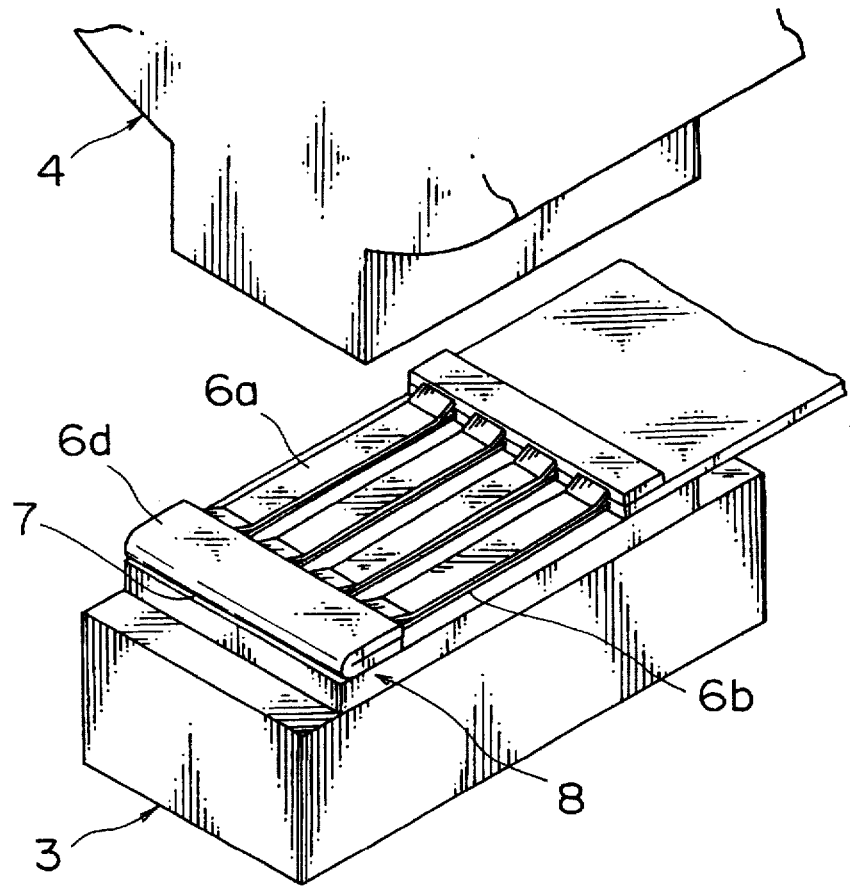
FIG. 6 is a perspective view showing a state before ultrasonic welding of the flat cable conductors and the copper sheet.
Figure 7:
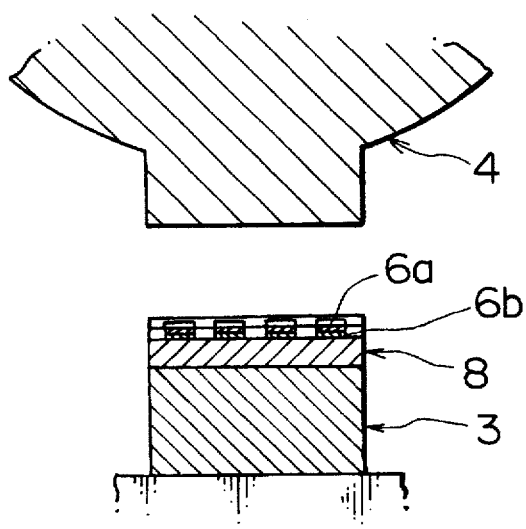
FIG. 7 is a longitudinal sectional view of FIG. 6.
Figure 9:
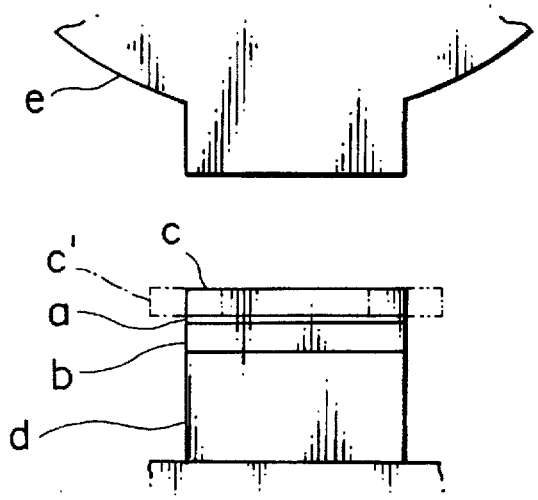
FIG. 9 is a side view showing undesirable shifts between an extremely small thickness metal sheet and a protective member in the prior art.
Figure 8:
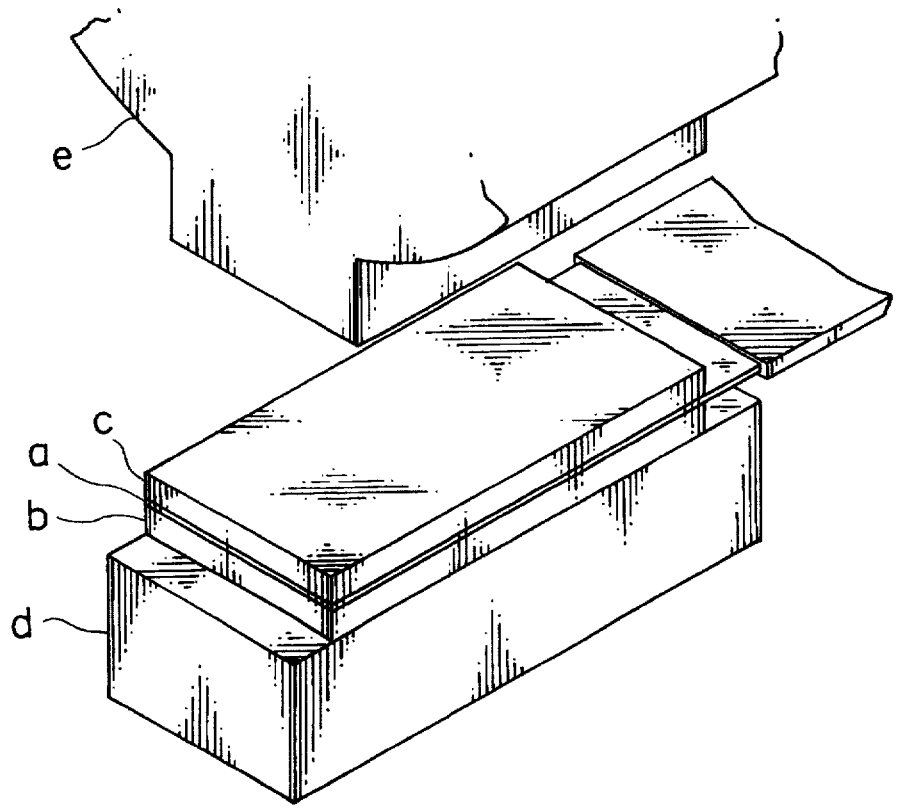
FIG. 8 is a perspective view showing a prior art ultrasonic welding method.

Finally, as shown in FIGS. 6 and 7, the protected conductive sheet 6b is laid over the copper sheet 8; the copper sheet 8 is set on the anvil 3; the horn 4 is abutted against the protecting conductive sheet 6a from above; and the protecting conductive sheet 6b is jointed to the copper sheet 8 by the ultrasonic welding.

Optionally, in this embodiment, the fore end covered portion 6c may be omitted if desired.

Accordingly, folding back the protecting conductive sheet 6a to lay over the protected conductive sheet 6b eliminates the provision of a protective member required in the prior art, resulting in reduction in the manufacturing cost. As the protecting conductive sheet 6a is folded back along the return line 7 on the middle covered portion 6d to lay over the protected conductive sheet 6b, the protecting conductive sheet 6a is stably positioned on the protected conductive sheet 6b. This improves the relative positioning or arrangement of the protecting conductive sheet 6a and the protected conductive sheet 6b, which, during the ultrasonic welding, prevents undesirable shifts between the protecting conductive sheet 6a and the protected conductive sheet 6b. The absence of undesirable shifts enables a stable and better ultrasonic welding.

Moreover, in the second embodiment including the first metal sheet consisting of 30 μm flat cable conductors and the second metal sheet of a 0.4 mm thickness copper sheet, the presence of the covered middle porion of the flat cable, which is used for the returning part, further improves the relative positioning between the protective portion and the protected portion.

What is claimed is:

1. An ultrasonic welding method for welding a first metal sheet to a second metal sheet comprising the steps of:

defining a protective portion, a protected portion and a middle portion therebetween in said first metal sheet, each of said protective portion and said protected portion having a length corresponding to a desired weld jointing length;

folding back said protective portion over said protected portion along a return line on said middle portion;

mounting said first metal sheet on said second metal sheet in such a way that said protected portion lays between said protective portion and said second metal sheet;

mounting said first metal sheet and said second metal sheet together on an anvil;

abutting a horn against the protective portion of said first metal sheet from above: and ultrasonically welding said first metal sheet and said second metal sheet.

2. An ultrasonic welding method as claimed in claim 1, wherein said first metal sheet has a smaller mechanical strength than said second metal sheet.

3. An ultrasonic welding method as claimed in claim 1, wherein said first metal sheet is a stripped conductive flat cable.

4. An ultrasonic welding method as claimed in claim 1, wherein said first metal sheet is a stripped conductive flat cable; said second metal sheet is a copper sheet; and said middle portion of said first metal sheet remains covered by its covering material.

5. An ultrasonic welding method as claimed in claim 3, wherein said flat cable remains covered by its covering material both in said middle portion and at a fore end portion of said flat cable.

6. An ultrasonic welding method as claimed in any one of claims 3 to 5, wherein said flat cable includes a plurality of conductors.

* * * * *